(12) United States Patent
Tsuruta

(10) Patent No.: US 6,554,598 B1
(45) Date of Patent: Apr. 29, 2003

(54) MOLD ASSEMBLY FOR ENCAPSULATING SEMICONDUCTOR DEVICE

(75) Inventor: Hisayuki Tsuruta, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/577,592

(22) Filed: May 25, 2000

(30) Foreign Application Priority Data

May 27, 1999 (JP) .......................................... 11-147673

(51) Int. Cl.⁷ .......................... B29L 70/72; H01L 21/56
(52) U.S. Cl. ............... 425/89; 264/272.14; 264/272.15; 264/272.17; 425/123; 425/125; 425/127
(58) Field of Search ................................. 425/116, 125, 425/127, 89, 544, 123; 264/272.15, 272.17, 272.14; 438/112

(56) References Cited

U.S. PATENT DOCUMENTS

| | | | | |
|---|---|---|---|---|
| 5,656,549 A | * | 8/1997 | Woosley et al. | 264/272.17 |
| 5,766,535 A | * | 6/1998 | Ong | 425/116 |
| 5,766,650 A | * | 6/1998 | Peters et al. | 425/116 |
| 5,776,512 A | * | 7/1998 | Weber | 425/116 |
| 5,891,384 A | * | 4/1999 | Miyajima | 425/116 |
| 6,187,243 B1 | * | 2/2001 | Miyajima | 425/116 |
| 6,224,360 B1 | * | 5/2001 | Miyajima | 425/89 |

* cited by examiner

Primary Examiner—Robert Davis
(74) Attorney, Agent, or Firm—Young & Thompson

(57) ABSTRACT

A mold assembly including: a first mold half; a second mold half relatively movable with respect to the first mold half; and a thin film disposes between the both mold halves and in contact with the surface of a semiconductor chip. Because of the contact between the edges of the surface of the semiconductor chip and the thin film, the portion of the semiconductor chip at which the burr is liable to be generated is protected and no burrs are generated.

6 Claims, 5 Drawing Sheets

MOLD ASSEMBLY FOR ENCAPSULATING SEMICONDUCTOR DEVICE

BACKGROUND OF THE INVENTION (a) Field of the Invention

The present invention relates to a mold assembly and a method for encapsulating a semiconductor device, more in detail to the mold assembly and the method capable of encapsulating a semiconductor chip with its surface exposed on the surface of a package.

(b) Description of the Related Art

A conventional method for molding the package of semiconductor chips includes two techniques, that is, a potting technique and a transfer technique.

In the conventional potting technique for encapsulating a semiconductor chip with the bottom surface thereof exposed on the surface of a package, a potting apparatus shown in FIG. 1 is used. The apparatus shown therein supplies a tape 102 reinforced with a frame 101 and moving on the sample stage of a potting device, and applies liquid resin thereto by moving a syringe 103 filled with the liquid resin along the tracks or locus specified by input data. The movement is effected either by the X-Y-Z-direction movement of the syringe itself or the X-Y-direction movement of the sample stage. The liquid resin in the syringe 103 is ejected for application by controlling the pressure of air in a dispenser unit 104.

The liquid resin is expensive and its handling including storage and use thereof is difficult. In addition, the amount of the ejected liquid resin depends on the viscosity of the resin, the pressure of the dispenser unit and a period of application time. The diversity of the amount of the ejected liquid resin generates an unevenness of the thicknesses in the molds. The planarity or flatness of the sample stage also generates the unevenness of the thicknesses in the molds.

Further, in the potting technique described above, some deficiencies exist mainly because no pressure can be applied during the application of the resin. The adherence between the semiconductor chip and the resin in the potting technique is weaker due to the application of no pressure than that in the transfer technique, and peeling-off of the resin at the interface is liable to occur. Further, in the potting technique, in order to prevent a void, the syringe slowly moves to apply the liquid resin, and accordingly a cycle of application time is long and its throughout is lower than that of the transfer technique. When the solder balls on the bottom surface of the tape are disposed outside of the chip (fan-out structure), an inconvenience for the balls may be generated such as co-planarity deficiency and ball missing due to the lower strength of the resin.

In order to remove the above deficiencies in the potting technique, the transfer technique for encapsulating semiconductor chips in a package by the molding is employed. However, the current transfer technique involves other problems such that (1) burrs are generated at an exposed portion and a manufacturing cost rises due to an addition of a step of removing the burrs, and (2) the chip is directly clamped with the mold to generate damages in the chip.

SUMMARY OF THE INVENTION

In view of the foregoing, an object of the present is to provide a mold assembly and a method for encapsulating a semiconductor device in which the molding for encapsulation preferably used in the transfer technique provides no burrs.

The present invention provides, in a first aspect thereof, a mold assembly for molding a semiconductor chip including: first and second mold halves disposed for relative movement with respect to each other in a first direction for closing and opening the mold assembly; and a mold releasing member disposed between the semiconductor chip and one of the first and second mold halves, the mold releasing member having a first surface in contact with the semiconductor chip during a closed state of the mold assembly, the mold releasing member having a property of being released from one of the first and second mold halves after molding by a resin, the first surface being larger than a surface of the semiconductor chip in contact with the first surface.

The present invention provides, in a second aspect thereof, a method for molding a semiconductor chip in a mold assembly having first and second mold halves disposed for relative movement with respect to each other, the method including the steps of: sandwiching a mold releasing member and the semiconductor chip between the first mold half and the second mold half, the mold releasing member having a property of elastically deforming, the releasing member and one of the first and second mold halves defining a cavity for receiving the semiconductor chip therein; and injecting resin in the cavity by using a first pressure lower than a pressure, which allows the mold releasing member to elastically deform, in a closed state of the mold assembly to thereby mold the semiconductor chip.

In accordance with the first and the second aspects of the present invention, the use of the mold releasing member can prevent the generation of burrs because the edges of the surface of the semiconductor device is in contact with the film.

The above and other objects, features and advantages of the present invention will be more apparent from the following description.

PREFERRED EMBODIMENTS OF THE INVENTION

Figure 1:
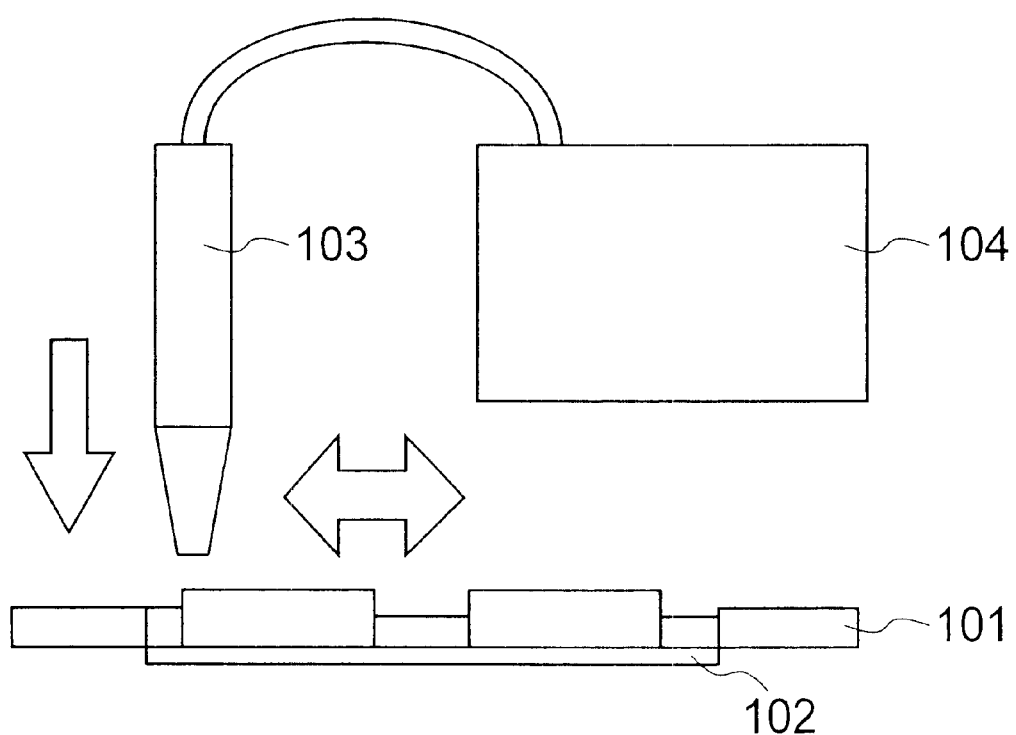
FIG. 1 is a vertical elevational view showing a potting apparatus used in a conventional method.

Now, the present invention is more specifically described with reference to accompanying drawings.

First Embodiment

A mold assembly for encapsulating a semiconductor device includes a transfer assembly mold having a fixed, upper mold half 11 and a movable, lower mold half 12. The lower mold half 12 includes a mold body member 13 having a top, shallow concave surface 14 and a chip holder 15 engaged and received in the concave surface 14.

The upper mold half 11 includes a holder 16 and a thrust mold 17. The thrust mold 17 is guided by the holder 16 for slidable movement with respect to the holder 16 in a direction of the relative movement between the upper mold half 11 and the lower mold half 12. An elastic member 18, preferably a coned disc spring, is disposed between the bottom surface of the holder 16 and the top surface of the thrust mold 17. A vacuum space 19 is formed around the thrust mold 17. A thin film 21 is disposed between the upper mold half 11 and the lower mold half 12. The film 21 has a property of being elastically deformed wherein it reduces the thickness thereof to some extent when compressed. The film 21 is sucked from a space between the holder 16 and the thrust mold 17 to be attracted to the upper mold half 11.

Figure 3:
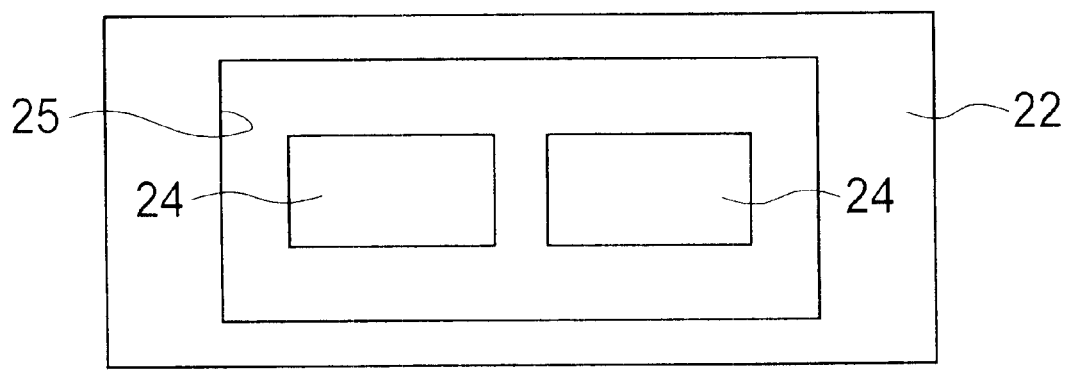
FIG. 3 is a top plan view showing a semiconductor chip to be encapsulated.
Figure 4:
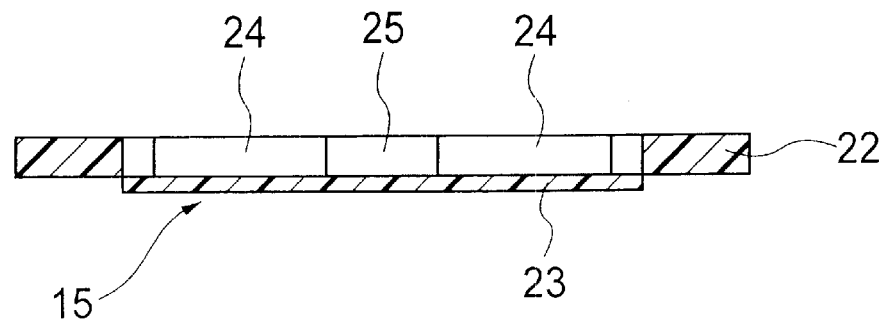
FIG. 4 is a cross-sectional view showing the chip of FIG. 3.

The chip holder 15 shown in FIGS. 3 and 4 includes a frame 22, a wired pattern layer 23 having an adhesive layer and solder balls, and a plurality of chips 24 arranged on the wired pattern layer 23. As shown in FIG. 4, the top adhesive layer of the wired pattern layer 23 is bonded onto the bottom surface of the frame 22. The plurality of chips 24 are bonded to the wired pattern layer 23 through an opening 25 formed in the frame 22.

Figure 2:
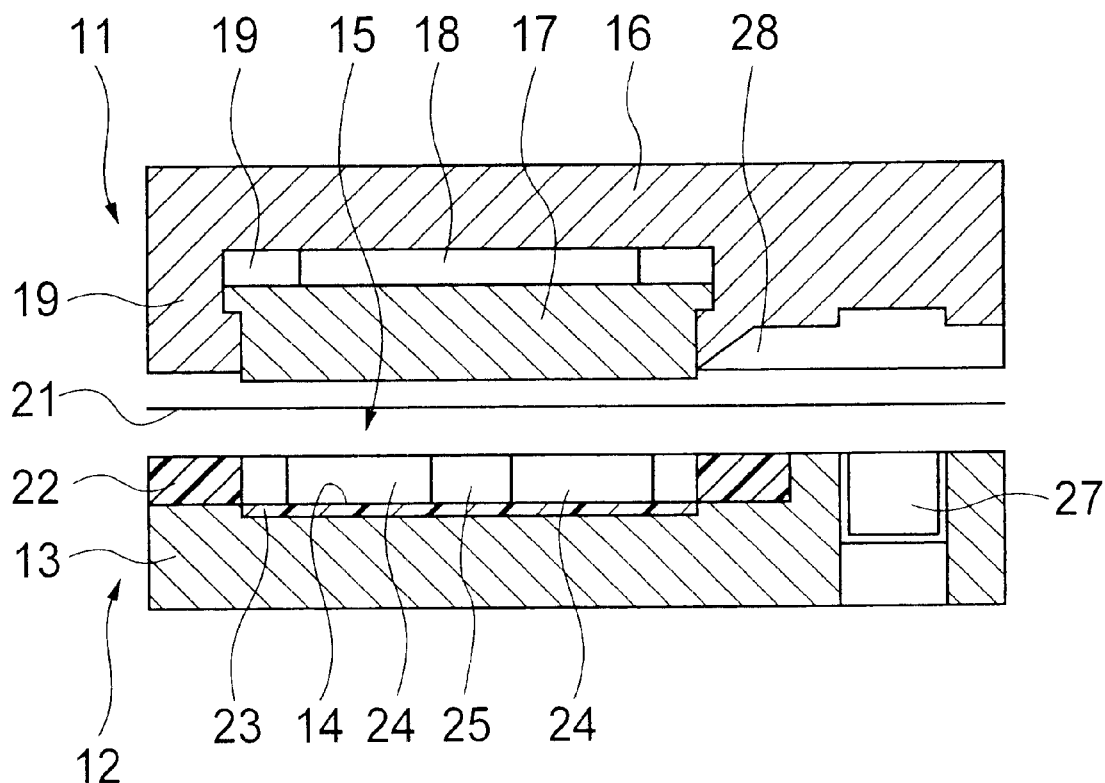
FIG. 2 is a vertical cross-sectional view showing an encapsulation mold for a semiconductor device in accordance with an embodiment of the present invention.

The chip holder 15 is mounted in the lower mold half 12 as shown in FIG. 2. The wired pattern layer 23 of the chip holder 15 is engaged with and received in the concave surface 14. The concave surface 14 has channels formed in accordance with the shapes of the chip holder 15 and the wired pattern layer 23.

Figure 5:
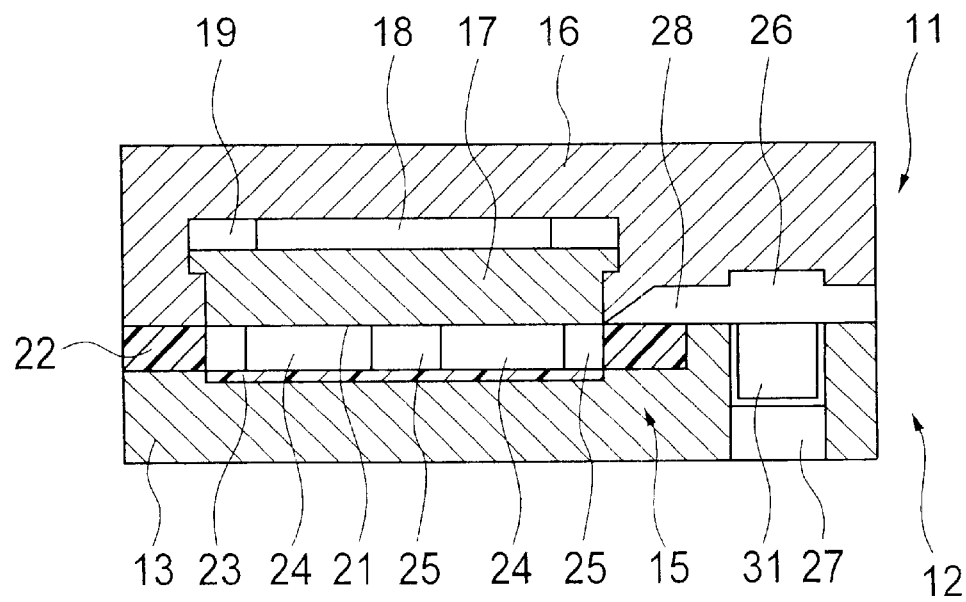
FIG. 5 is a cross-sectional view showing the encapsulation mold of FIG. 2 when it is fastened.

The mold assembly is closed by ascending the lower mold half 12 to be in close contact with the upper mold half 11 as shown in FIG. 5. An enclosed cull 26 is formed between the upper mold half 11 and the lower mold half 12 and solid resin is supplied in the cull 26. A plunger 27 is fitted in the lower mold half 12, and a runner 28 communicated with the cull 26 is formed in the upper mold half 11. The bottom of the runner 28 is open at the bottom surface of the holder 16.

The film 21 is automatically supplied and discharged by a known mechanism not shown in the drawings. The mechanism may include one or more supply rollers for supplying the film from a wound film roll and one or more discharge rollers for discharging the used film by winding-up after the transfer molding. The rollers are disposed at both ends of the upper mold half 11, and the supply and the discharge of the film are simultaneously conducted by moving the film by the plurality of rollers.

In the closed state of the mold assembly shown in FIG. 5, the bottom peripheral surface of the holder 16 and the bottom surface of the thrust mold 17 are in contact with the top surface of the film to form a single plane.

The resin 31 in the cull 26 is melted with heat, supplied to the cavity through the runner 28 by the pressure applied by the plunger 27, and then supplied to the opening 25 of the chip holder 15.

Figure 6:
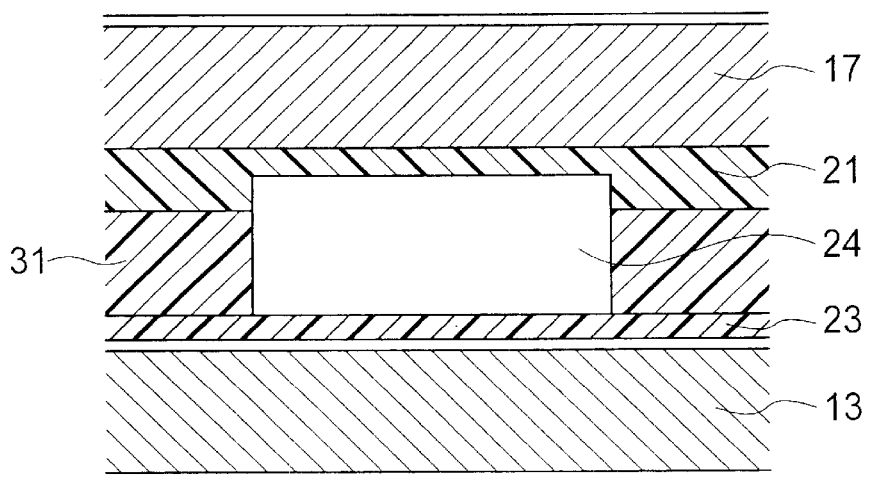
FIG. 6 is an enlarged vertical cross-sectional view of the mold for showing the function thereof.

The closed state is shown more in detail in FIG. 6 in which the film 21 is pressed between the resin 31 and the thrust mold 17 to be elastically deformed and a part of the film 21 is compressed by the plurality of the chips 24. Since the melted resin 31 does not enter into the space between the top surface of the chip 24 and the bottom surface of the thrust mold 17, no burrs are generated on the edges of the top surface of the chips 14.

The thrust mold 17 of the upper mold half 11 resides in a floating state in order to prevent damages, such as a crack in the chip 24, generated due to abnormal pressure rise between both the mold halves and unevenness of the chip thicknesses. The setting of the pressure by the thrust mold 17 at this time is higher than an injection molding pressure so that no adverse influence by the injection molding pressure is produced. The pressure determined in this manner effectively prevents the generation of the burrs mentioned before. While a preferable effective injection pressure is 100 kg/cm$^2$, a preferable setting of the pressure by the thrust mold 17 is 200 kg/cm$^2$.

The combination of the film 21 and the pressure by the thrust mold 17 enables the uniform pressing of all the chips regardless of the unevenness of the chip thicknesses, thereby effectively preventing the generation of the burrs on the surface.

Figure 7:
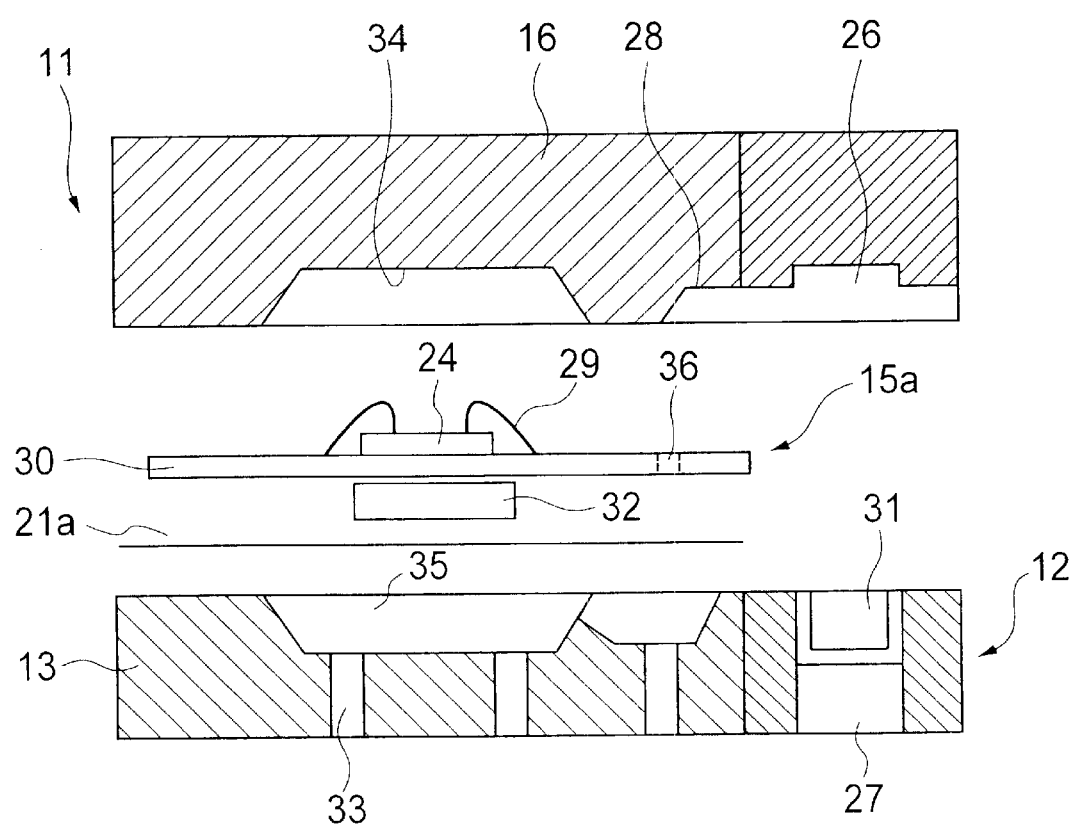
FIG. 7 is a vertical cross-sectional view showing an encapsulation mold for semiconductor device in accordance with another embodiment.

In another embodiment shown in FIG. 7, a chip holder 15a is different from the chip holder 15 in FIG. 3. A chip 24 is fixed onto a lead frame 30, and a bonding wire 29 connects the lead frame 30 and the electrode of the chip 24.

A heat spreader 32 is opposed to the bottom surface of the lead frame 30. An upper cavity 34 into which the chip 24 and the lead frame 30 enter is formed at the bottom part of the upper mold half 11, and a lower cavity 35 is formed at the corresponding part of the lower mold half 12. In the present embodiment, the heat spreader 32 in place of the chip 24 is exposed and encapsulated in the lower cavity 35.

The film 21a is supplied between the lower mold half 12 and the chip holder 15a, and the mold assembly is closed as shown in FIG. 7. The film 21a is pressed between the bottom surface of the lower cavity 35 and the bottom surface of the heat spreader 32. The side surfaces of the heat spreader 32 are covered with the resin supplied from the runner 28 while exposing the bottom surface of the heat spreader 32.

Also in the present embodiment, the generation of the burrs at the edges of the surface of the heat spreader 32 is prevented. In this case, the burr generation is prevented by properly pressing the film 21a on the heat spreader 32 by the injection pressure of the resin. The floating mechanism of the elastic member 18 in FIG. 2 is unnecessary in the present embodiment because the chip 24 is not oppressed.

Since the above embodiments are described only for examples, the present invention is not limited to the above embodiments and various modifications or alternations can be easily made therefrom by those skilled in the art without departing from the scope of the present invention.

What is claimed is:

1. A mold assembly for molding a semiconductor chip comprising:

first and second mold halves disposed for relative movement with respect to each other in a first direction for closing and opening said mold assembly;

a mold releasing member disposed between the semiconductor chip and one of said first and second mold halves, said mold releasing member having a first surface in contact with said semiconductor chip during a closed state of the mold assembly, said one of said first and second mold halves applying a clamping force of about 200 kg/cm$^2$ on the semiconductor chip during said closed state of the mold assembly to prevent burrs, said mold releasing member having a property of being released from said one of said first and second mold halves after molding by a resin, said first surface being larger than a surface of the semiconductor chip in contact with the first surface, wherein the mold releasing member is disposed between a plurality of semiconductor chips and one of said first and second mold halves, said plural semiconductor chips being in a single cavity of the mold assembly.

2. The mold assembly as defined in claim 1, wherein said mold releasing member is a film having a substantially uniform thickness.

3. The mold assembly as defined in claim 2 wherein said film elastically deforms in a direction of the thickness.

4. The mold assembly as defined in claim 1, further comprising a mold holder for holding said first mold half for allowing an elastic movement of the first mold half in said first direction.

5. The mold assembly as defined in claim 1, wherein the clamping force is uniform on each of the plurality of semiconductor chips.

6. A mold assembly for molding a semiconductor chip comprising:

first and second mold halves disposed for relative movement with respect to each other in a first direction for closing and opening said mold assembly;

a mold releasing member disposed between the semiconductor chip and one of said first and second mold halves, said mold releasing member having a first surface in contact with said semiconductor chip during a closed state of the mold assembly, said one of said first and second mold halves applying a clamping force on the semiconductor chip during said closed state of the mold assembly to prevent burrs, said mold releasing member having a property of being released from said one of said first and second mold halves after molding by a resin, said first surface being larger than a surface of the semiconductor chip in contact with the first surface, wherein the mold releasing member is disposed between a plurality of semiconductor chips and one of said first and second mold halves, said one of said first and second mold halves comprising a holder element, a thrust element, and an elastic member between said holder element and said thrust element for absorbing variations in thickness of said plural semiconductor chips.

* * * * *